(12) United States Patent
Pons Gonzalez et al.

(10) Patent No.: US 10,468,874 B2
(45) Date of Patent: Nov. 5, 2019

(54) COMBINED DEVICE FOR ELECTRICAL PROTECTION AGAINST TRANSIENT OVERVOLTAGES AND MONITORING OF AN ELECTRICAL INSTALLATION

(71) Applicant: CIRPROTEC, S.L., Terressa (Barcelona) (ES)

(72) Inventors: Carles Pons Gonzalez, Terressa (ES); Jose Antonio Martin Peidro, Terressa (ES)

(73) Assignees: CIRPROTEC, S.L., Terressa (Barcelona) (ES); MERSEN USA NEWBURYPORT-MA, LLC, Newburyport, MA (US)

( * ) Notice: Subject to any disclaimer, the term of this patent is extended or adjusted under 35 U.S.C. 154(b) by 359 days.

(21) Appl. No.: 15/113,121

(22) PCT Filed: Feb. 5, 2015

(86) PCT No.: PCT/ES2015/070075
§ 371 (c)(1),
(2) Date: Jul. 21, 2016

(87) PCT Pub. No.: WO2015/118204
PCT Pub. Date: Aug. 13, 2015

(65) Prior Publication Data
US 2017/0012425 A1    Jan. 12, 2017

(30) Foreign Application Priority Data
Feb. 5, 2014 (ES) .................................. 201430144

(51) Int. Cl.
*G01R 27/18* (2006.01)
*H01H 83/10* (2006.01)
(Continued)

(52) U.S. Cl.
CPC ....... *H02H 9/042* (2013.01); *G01R 19/16576* (2013.01); *G01R 19/2513* (2013.01);
(Continued)

(58) Field of Classification Search
CPC .......... H02H 1/003; H02H 3/17; H02H 5/105; H02H 9/042; G01R 27/18; G01R 27/20
See application file for complete search history.

(56) References Cited

U.S. PATENT DOCUMENTS 6,304,188 B1    10/2001    Subak et al.
6,775,121 B1    8/2004    Chaudhry
(Continued)

FOREIGN PATENT DOCUMENTS

CN    1391317 A    1/2003
CN    201523223 U    7/2010
(Continued)

*Primary Examiner* — Ronald W Leja
*Assistant Examiner* — Christopher J Clark

(57) ABSTRACT

The present invention refers to a combined device for electrical protection against transient overvoltages and monitoring of an electrical installation, of those used in installations with alternating single-phase or multi-phase current, or direct current, of those formed by cartridges plugged in to a fixed base or formed by a monoblock, both types of devices comprising one or more components for overvoltage protection in each plug-in cartridge or in the monoblock, characterised in that it comprises monitoring means configured so that they continuously measure and process one or several parameters related to the state of the electrical installation and the protective device itself, and connected to said monitoring means a series of indication means configured to indicate one or a combination of output parameters are comprised.

27 Claims, 12 Drawing Sheets

(51) Int. Cl.
*H02H 9/04* (2006.01)
*H02H 1/00* (2006.01)
*G01R 19/25* (2006.01)
*H02H 3/17* (2006.01)
*G01R 19/165* (2006.01)
*H02H 1/04* (2006.01)
*H02M 7/04* (2006.01)
*H01H 71/02* (2006.01)
*H02H 11/00* (2006.01)
*G01R 35/00* (2006.01)

(52) U.S. Cl.
CPC ............ *G01R 27/18* (2013.01); *H01H 83/10* (2013.01); *H02H 1/003* (2013.01); *H02H 1/043* (2013.01); *H02H 3/17* (2013.01); *H02M 7/04* (2013.01); *G01R 35/00* (2013.01); *H01H 71/0228* (2013.01); *H02H 11/002* (2013.01); *H02H 11/005* (2013.01)

(56) References Cited

U.S. PATENT DOCUMENTS

| | | | | |
|---|---|---|---|---|
| 6,947,266 | B1 * | 9/2005 | Billingsley | ............ H02H 5/105 361/104 |
| 7,023,680 | B1 * | 4/2006 | Johnson | ................ H02H 5/105 324/74 |
| 2002/0089334 | A1 | 7/2002 | Lee et al. | |
| 2006/0071675 | A1 * | 4/2006 | Batten | .................... G01R 31/42 324/710 |
| 2012/0134063 | A1 | 5/2012 | Weil | |
| 2017/0110869 | A1 * | 4/2017 | Bargues | ................. H02H 1/003 |

FOREIGN PATENT DOCUMENTS

| | | | | |
|---|---|---|---|---|
| CN | 102074947 A | 5/2011 | | |
| CN | 202142728 U | 2/2012 | | |
| CN | 202218000 U | 5/2012 | | |
| EP | 1267468 | 12/2002 | | |
| EP | 1482317 A1 * | 12/2004 | ............. | G01R 27/18 |
| EP | 1950575 A2 * | 7/2008 | ............. | G01R 27/18 |

* cited by examiner

COMBINED DEVICE FOR ELECTRICAL PROTECTION AGAINST TRANSIENT OVERVOLTAGES AND MONITORING OF AN ELECTRICAL INSTALLATION

FIELD OF THE INVENTION

The present invention refers to a combined device for electrical protection against transient overvoltages and for the monitoring of an electrical installation.

STATE OF THE ART

Currently the available devices for protection against transient overvoltages (designated in this field of the technique by the abbreviation "SPD") are commonly used to protect the fixed electrical installations and the points of load connected to the same against overvoltages caused by alterations due to atmospheric phenomena (such as lightning), network manoeuvers of different types of switching manoeuvres.

This type of protection device ("SPD") is used in electrical installations supplied by the mains or other types of generators and also in installations supplied by means of direct current, for example, photovoltaic generators.

Such SPD devices have at least one protective component, with non-linear characteristics, intended to limit the transient overvoltages and divert to earth the transient current impulses. These protection components are mainly varistors, gas arresters, arc arresters, "spark-gaps", suppressing diodes, triacs, thyristors, MOSFETs, or other technically equivalent components including others that may be developed in future, or combinations thereof.

The SPD devices are generally installed on the protection and control board of the fixed installation that is located at the origin of the installation, and may also be complemented by other SPD devices located in downstream sub-distribution boards.

The SPD devices generally incorporate disconnection devices that disconnect from the mains the component/components to be protected when reaching the end of their useful life, for example by means of thermal fuses, with the purpose of preventing permanent failures in the installation.

There are several important parameters that define the characteristics of a SPD device to which we will refer below. These include:

$U_c$: the maximum continuous voltage that may be applied in every protection mode.

$U_{res}$: the residual voltage, i.e., the peak voltage appearing between the terminals due to the passage of a discharge current.

The waveforms used in the tests for the characterisation of the SPD devices are current impulses, generally of the 8/20 µs or 10/350 µs type and voltage impulses of 1.2/50 µs; their peak value is specified by the manufacturer and characterises the SPD device.

In general, there are two different formats or types for the practical implementation of an SPD device:

i) Plug-in devices, in which every protection component/components is located inside a different plug-in cartridge inserted on a fixed base together with other cartridges, located on said fixed base, the connection means for the wiring between the SPD device and the mains. The electrical connection between the protection component inside the cartridge and the fixed base is made by means of metallic connection terminals in the cartridge for insertion in metallic lodgings provided on said fixed base, said lodgings being connected to the connection means of the SPD device.

ii) Compact or monoblock, in which all of the protection components are located within a single enclosure, incorporating means for the connection of the wiring between the SPD and the mains.

Compact-type SPDs have the disadvantage that in the event of the failure of one or various protection components, it is necessary to replace the whole device to maintain complete protection, which means that the device must be disassembled and assembled again completely. Both drawbacks incur high costs that are further increased in the case of multiple SPD.

On the contrary, plug-in type SPD devices (are formed by plug-in cartridges on a fixed base) have the advantage that in the event of failure of the protection component or the components located in a given cartridge, only that cartridge must be replaced, without it being necessary to replace the rest of cartridges or disassemble the SPD device from the electrical installation. This type of plug-in SPD device has yet another advantage related to the initial verification of the electrical installation: in the carrying out of inspection tests carried to verify the dielectric withstand and insulation, to which is required to apply alternating and direct voltages that are higher than the activation voltages of the SPD devices (as their function is to limit overvoltage); in the case of a plug-in SPD device, the tests may be carried out by simply removing the cartridges, while with compact SPD protectors it is necessary to remove the wires and to connect them again, thereby increasing operation times and costs.

Spanish Patent No ES2266741 "Equipment for the measurement of ground resistance", in the name of the same applicant, shows in FIG. 1 a measurement device, in which it is stated that a current signal is injected when closing the contact 11 governed by the microcontroller 1, with the necessary energy to inject the signal obtained from the battery 10.

In order for the battery to supply high current impulses in each half cycle of the network in a circuit like the one in the present case, it must be large, and so the system described in said patent could not be integrated into a cartridge of an SPD device, in addition, whether loadable or not, it would have to be replaced when reaching the end of its useful life.

It is also stated in claims 1, 5, 6 and 7 of said patent that the current injection is made at approximately 90° of the AC voltage supply, so that the whole variation in voltage is due to the peak current which has a short duration, and not to the evolution of the half wave of the AC supply. The consideration that at 90° the variation of the AC signal is small is true for a pure sinusoidal voltage containing no harmonics or distortions, in which case said consideration would not necessarily be met. It is necessary to consider not only the eventual harmonics in the AC voltage supply, but also other problems caused by the harmonics in the current supply. This current causes a fall in the voltage of the neutral conductor between the measuring equipment and the voltage-generation plant, and depending on the existing harmonics, that fall in voltage may cancel or substantially reduce the value of the voltage stored in the capacitor, causing its discharge. This would result in the injected current impulse being very small or null, in which case the result of the measurement would be erroneous.

The above operating behaviour constitutes a very serious drawback, as nowadays, most equipment used in electrical installations causes harmonics, for instance, equipment used to process and control production systems with speed variators, air conditioning, elevators, computers, fluorescent lamps and most current household appliances. The operation of such equipment is not constant, for which reason the content and amplitude of the harmonics will vary, causing erroneous and erratic measurements of the earth resistance, and also causing unjustified alarms. In addition, it should be considered that the impedance of the earthing system may have a high capacitive component, depending on the capacitive relation between the discharge capacitor, the capacity of the earthing system (which is variable) and the voltage existing at the time of injecting the impulse in each of them it can be obtained very small current impulses, leading to the problems indicated above in relation to the measurement.

In addition to the above, to obtain the current injection at 90° the 0° angle must be determined in a reliable manner, i.e., by determining the zero passage of the sinusoidal signal of the voltage supply, as is shown in FIG. 1. This could be done using the voltage obtained in the resistive dividers 6 or 7, as in the case of noise existing in the AC voltage, the measurement could be erroneous and therefore, the theoretical actuation point of 90° would not correspond to an area in which the variation of the sinusoidal signal was small. This document does not disclose or suggest any filtration means to eliminate the stated problem, for instance, using active, passive or software filters for the microcontroller.

Also referring to the same patent document and in relation to the protection against transient overvoltages as mentioned above, the varistor 4 and the gas discharge 5, it is usual to use this type of components in electronic devices which will be assembled permanently in the electrical installation, nevertheless they are dimensioned to protect the device itself thereby meeting the requirements of the electromagnetic compatibility tests established in the product standards, as said tests are carried out using impulses of several kV but with low energy. This type of protection is unable to withstand transient current impulses as high as those produced by the atmospheric discharges (which can reach up 100 kA), i.e., it will not be suitable for the protection of installations and loads connected downstream of said measurement instrument. The use of protective components with high energy in the measuring instrument in patent ES2266741 would be totally insufficient to protect both the installation and the measurement equipment, as the circulation of the current impulses produced by the atmospheric discharges through the protection components creates extremely strong electromagnetic fields, which would induce high currents and voltages in the electronic circuits of the measurement instrument, causing its destruction.

OBJECT OF THE INVENTION

One of the objectives of this invention is the disclosure of a device that will provide protection against transient overvoltages and also monitor the electrical installation and inform the user about the current margins of certain parameters of the device and the electrical installation, in order to inform and warn the user about the status of the device and of the electrical installation.

Another objective of the invention is the disclosure of a combined protective and monitoring device that takes up the smallest possible space on the protection and control board in which it will be habitually installed.

Another objective of the invention is to disclose a combined protective and monitoring device that is easy to be replaced in the case of the failure of the protective or the monitoring section.

Another objective of the invention is to disclose a combined protective and monitoring device for the electrical installation with a low manufacturing and installation cost.

Yet another objective of the invention is to disclose a combined protective and monitoring device that does not interfere with the operation of other protective devices (for example, a residual current circuit breaker, hereafter "RCD") or other equipments installed in the same installation or in adjacent installations.

DESCRIPTION OF THE INVENTION

It is a combined device that not only protects against transient overvoltages but also monitors an electrical installation, of the type used in single-phase alternating voltage installations or multi-phase or direct voltage installations, of the type formed by cartridges for plugging into a fixed base or formed by a monoblock. Both types of devices usually comprise a protective unit formed by one or more components protecting against transient overvoltages laid out in each plug-in cartridge or all of them contained in the monoblock. Said protection components may be varistor/s, gas arrester/s, arc arrester/s, "spark-gap/s", suppressing diodes/s, triac/s, thyristor/s, and/or MOSFET/s, and/or any other equivalent component that is known or could be developed in the future.

The invention is characterised mainly by comprising a configured set of supervision devices that permanently measure and process the most important parameters of the system installation, operation and maintenance processes, and are connected to said monitoring means, that also includes a set of configured indication means that inform the user of the status of the installation and of the device.

Preferably, the mentioned indication means show one or a combination of the following parameters or output conditions:

Whether or not the value of the earth resistance ($R_{PE}$) measured by the protection and supervision device is within the established limits or margins $R_{PEmin}$ and $R_{PEmax}$.

Whether or not the connection of the protection device and the electrical installation is correct: (a) in the case of alternating voltage supply: L, N, PE or PEN; or (b) in the case of direct voltage supply: positive, negative and PE.

Whether or not the voltage of the earthing system is $v_{PE}$ is $\geq v_{PEmax}$.

Whether or not the voltage supply on an alternating or a direct voltage network $V_L$ is within normal predetermined limits, that is, whether $V_L$ is between $V_{Lmin}$ and $V_{Lmax}$.

Optionally, another parameter or output condition could be the indication of whether at least one of the component groups of the protection against overvoltages integrated into the protection device has reached the end of its useful life.

Preferably, the above indication means show the existence of the five parameters or out conditions described above, although they could also indicate a smaller combination of said parameter such as two or three of those parameters.

According to a preferable application of the invention, the indication means are formed by a first type of indicator and a second type of indicator. The first type of indicator, preferably a lighted indicator, is activated in different ways (for example, giving the indication 1, 2, 3 and 4) and providing information on the first four parameters or out conditions, that is, whether or not the connection to the mains and/or the $v_{PE} \geq v_{PEmax}$ voltage is correct or not and/or whether the mains voltage ($v_L$) is $v_{Lmin} > v_L > v_{Lmax}$. When all the foregoing is correct, that lighted indicator gives the corresponding indication according to the $R_{PE}$ value obtained within the selected margins. If necessary, a different indication could be provided if that the protective component/s included in the cartridge has reached the end of its useful life.

The second type of indicator, lighted or not, indicates whether or not the protective component/s included in a given cartridge or the monoblock has/have reached the end of its/their useful life.

If that invention is applied to plug-in devices, i.e., devices formed by an assembly of one or more cartridges inserted on a fixed base, at least one of the cartridges forming the assembly also includes, in addition to the components protecting against transient overvoltages, the above mentioned supervision and indication means. The other cartridges forming the assembly can also have indication means showing the characteristics of the cartridge, such as the end of the useful life of the protective component/s in each cartridge.

Inside a cartridge, different combinations of protective components can be used, such as a varistor series connected to a gas arrester, various varistors or gas arresters in parallel or a single component such as varistors, gas arresters, arc arresters, "spark-gap/s", suppressing diode/s, triac/s, thyristor/s, and/or MOSFET/s as well as other equivalent components. Hereafter these are referred to as "protective components", but it should be understood that this could also be a combination of components.

Optionally, the first type of indicator (which we will refer to as "$R_{PE}$ value indicator") could also give an additional indication, if the protective components included in the cartridge where that first indicator is located reach the end of their useful life.

The first type of indicator is formed by one or more LEDs in one or more colours, each of them providing different information; for instance by lighting up in different colours depending on the value ranges of the parameters or out conditions or lighting up permanently or by flashing. The second type of indicator can be formed by one or more LEDs or be of a mechanical type. Alternatively, or in combination with the LEDs, the first type of indicator may be constituted by a display.

The protective and monitoring device described in this invention is preferably installed on the protection and control board of the fixed installation located at the origin of the installation, and may also be completed by other SPD devices located downstream. To that end, the SPD device of the invention is provided with suitable connection means for installation on a standard DIN rail or a similar element.

Depending on the characteristics of the supply source and distribution network, the SPD may use different modes of protection (differential and common modes), for instance, line-to-line, line-to-earth, line-to-neutral and neutral-to-earth.

Optionally, the cartridges and the fixed base of the protective and monitoring device of the present invention may be provided (when of plug-in type), with mechanical means adapted to prevent the insertion of cartridges in an incorrect position on the fixed base or ensure they do not correspond to different voltage ratings, for instance, inserting a cartridge that must be connected between L-N into the housing of an N-PE cartridge or vice versa.

The invention also foresees the use of protective and monitoring devices of a multi-pole type, which offer more than one protection mode. Also to be considered in addition to this type is a combination of single-pole SPD that are electrically interconnected.

Preferably, in the case of applying the invention in the plug-in execution, as the supervision and indication means are located inside of one of the plug-in cartridges, permitting the permanent supervision of the state of the installation, the requirements related to low cost, ease of installation and replacement in the event of failure are properly fulfilled. In this case, it should be considered that a cartridge has extremely small dimensions, and in many cases, the width of the cartridge is 17.5 mm or 35 mm, and that the protective components are located inside that cartridge.

With the objective of also integrating the monitoring and indication means of said cartridge, and thus obtaining the best use of the space on the protection board, the device of the present invention includes a built-in double protection against transient overvoltages: a first stage formed by the protective components located inside the cartridge, which absorb the main part of the energy leaving between its two poles a reduced residual voltage; this voltage impulse already has low energy and its mission is to limit it to acceptable values for the supervision circuit in a second protection stage. As an example, said second stage may be composed of a small impedance, Z and a varistor, V with reduced dimensions. This second protection stage prevents the destruction or faulty operation of the supervision circuits as it further reduces the perturbations that could affect the same due to residual voltage in the protective component ($U_{res}$) or due to the electromagnetic field that is generated.

Therefore, the device for protection against transient overvoltages and supervision which is the object of the invention does not need any addition space on the protection and control board, thus making the device low-cost, as it uses the same enclosure and is created using the same manufacturing process as that of a normal cartridge and it is easy to replace in the event of a failure, (both the protective component and the monitoring device) and informs the user in the event that any of the above problems exists. An important requisite that is fulfilled is that the device does not interfere with the operation of other protective devices (for example, a residual current circuit breaker, hereafter, RCD) or equipment within the same installation or in adjacent installations.

In specific cases, part of the monitoring and/or indication means could be located within the fixed base, which receives the plug-in cartridges.

The protective and monitoring device described in the present invention may have disconnecting devices that trigger the disconnection of the protective component/s from the supply means when they have reached the end of their useful life, for example thermal fuses, in order to prevent the permanent failure of the installation. When said disconnecting devices are triggered, they cause an indicator in the SPD device to warn the user of this (for example, a lighted or a mechanical indicator), but this indicator may also be outside the SPD device or it may exist with both indications. In some configurations of the electrical network, it may not be necessary to implement said warning device.

The information on the state of the installation and/or of the SPD and/or of the protective component/s may be provided through wireless or wired transmission means. Said wireless transmission means may be included in the same cartridge or they may be totally or partially included in the fixed base of the SPD or internally in a compact SPD.

Generally, two types of connections are used, depending on the configuration of the electrical network supply system; for instance, FIG. 22 shows the connection configuration for a three-phase network.

Depending on the electrical network supply system (for example, TT, TN-S or TN-C-S), L1, L2 and L3 are connected to the line conductor, N to the neutral conductor and PE to the protective conductor. In case of a TN-C system, the PEN conductor operates as protective conductor and neutral conductor. Downstream of the SPD device the installation, loads and equipment to be protected against overvoltages are connected, with the protective conductor connected to the accessible conductive parts of the materials and the electrical equipment that are not normally subject to electrical voltage but could be supplied with voltage in the event of a fault.

The PE conductor (or PEN), necessary for protection against electric shock, is connected to the earthing system, which may be local (in the building) or provided by the electric utility. However, if the building where the installation is carried out that must be protected has an external lightning protection system (for example, a lightning rod), a local earthing system must be created to disperse the current impulses of the lightning. This earthing point must be connected to the one corresponding to the rest of the building at a single point of the installation.

The general objectives of the earthing are as follows:
To permit the discharge to the earth of the fault currents or atmospheric discharges.
To maintain the potentials produced by the fault currents within the safety limits and/or to ensure the operation of the protective system in a timely manner, taking into account the safety of people and equipment.
To maintain a reference potential at some point in the electric or electronic system. This point is very important when installing a SPD device, as if said device were not installed, a transient overvoltage caused by manoeuvres in the electrical network or an atmospheric discharge would cause a tremendous increase in said potential (hundreds of kV), causing the failure of the insulation in the installation or in the connected equipment.

However not only is it necessary to maintain a low impedance in the earthing (for example, trough the correct installation and maintenance of the electrodes buried in the ground, but it is also necessary for the impedance from the point of connection of the protective conductor of the SPD to the complete earthing system to be as low as possible, both from the point of view of the safety of people and equipment but also considering protection against overvoltages. Except in the case of the disconnection or break of the protective conductor and/or the earthing electrodes, the impedance of the system usually changes very slowly as it depends mainly on the humidity and the temperature of the ground, which is generally seasonal, although this also depends on the progressive corrosion of the earthing electrodes.

Another anomalous situation that may occur is that the earthing system is submitted to voltage which, although not sufficient to trigger the protective means of the installation, could cause harm to people or equipment.

Errors could also occur in the connection of the conductors of the SPD device or in the installation, which could affect the operation of some equipment or even cause damage to the SPD device. It might occur that in a three-phase protector the connection of one line is accidentally changed for those of the neutral conductor, which would in most cases causes permanent damage to the protective components connected to the other two lines.

Other errors in the connection of the line neutral and the protective conductors should also be taken into account.

DESCRIPTION OF THE FIGURES

Below is a list of the different parts of the invention shown in the figures and designated by the following numerical references; (10, 10', 10", 10''', 10'''') protective and supervisory devices, (11) plug-in cartridge, (12) fixed base, (13) $R_{PE}$ value optical indicator and other indications, (14) indicator of the end of the useful life of the protective component, (15) $R_{PE}$ value optical indicators and other indications formed by LEDs, (16) insertion of the first connection terminal, (17) insertion of the third connection terminal, (18) connection terminals of the cartridge to the fixed base, (19) printed circuit board with the electronic circuitry, (20) protective component, (21) second stage of the protection against transient overvoltages, (22) AC/DC converter, (23) adapter, (24) adapter, (25) microcontroller, (26) resistances, (27) LED diodes, (28) thermal disconnecting device.

In the figures:

FIG. 2 shows the case of a cartridge with three lighted indicators for the $R_{PE}$ value formed by LEDs, FIG. 3 shows the case of a cartridge having a sole lighted indicator for the $R_{PE}$ value, FIG. 4 shows the case of a cartridge with a first type of lighted indicator for the $R_{PE}$ value and the second type of indicator for the end of the useful life of the protective component, and FIG. 5 shows the case of a cartridge with three lighted indicators for the $R_{PE}$ value formed by LEDs and a second type of indicator for the end of useful life of the protective component.

FIG. 7 shows a view of an example of application in which the protective and monitoring device is of the single-phase type (N, L), and fitted with indication means formed by a first indicator and a second indicator. The first indicator, preferably an lighted indicator, is activated differently (for example, giving an indication 1, indication 2, indication 3 and indication 4) and providing information on whether the connection to the network and/or the voltage $v_{PE} \geq v_{PEmax}$ and/or the network voltage $(v_L)$ $v_{Lmin} > v_L > v_{Lmax}$ are correct or not. When all of the foregoing is correct, the same lighted indicator gives the corresponding indication according to the $R_{PE}$ value obtained within the selected margins. If it should also be necessary, another kind of indication could be given in the event that the protective component included in the cartridge has reached the end of its useful life. The second indicator located in the other cartridge gives an indication (which may or may not be lighted) in the event that the protective component/s included in the same (L) has/have reached the end of their useful life.

FIG. 8 shows a view of an example of an application in which the protective and monitoring device is of the three-phase type (N, L1, L2, L3), which is fitted with indication means formed by a first lighted indicator that is activated in a different way, providing information on whether the connection to the network, and/or the voltage $v_{PE} \geq v_{PEmax}$ and/or the network voltage $(v_L)$ $v_{Lmin} > v_L > v_{Lmax}$, are correct or not. When all the foregoing is correct, the first optical indicator provides the indicator corresponding to the value obtained for $R_{PE}$ within the selected margins. If necessary, it could also give a different indication in the event that the protective component inside the cartridge has reached the end of its useful life. The indicators located in the other three cartridges (L1, L2, L3) provide an indication (which may or may not be lighted) as to whether the protective component included in said cartridges has reached the end of its useful life;

FIG. 9 shows a view of an application in which the protective and monitoring device is for photovoltaic applications (L+, PE, L−), which is fitted with indication means formed by a first lighted indicator that is activated in a different way, giving information as to whether the connection to the supply voltage is correct or not, and/or the voltage $V_{PE} \geq v_{PEmax}$, and/or the supply voltage $v_{Lmin} > v_{L+} - v_{L-} > v_{Lmax}$, are correct or not. When all of the foregoing is correct, the same optical indicator provides the corresponding indication according to the $R_{PE}$ value obtained within the selected margins. The cartridge has another indicator (which may or may not be lighted), to indicate that the protective component included in said cartridge has reached the end of its useful life. The indicators of the other cartridges (L+, L−) indicate, by lighted or non-lighted means, that the protective component included in them has reached the end of its useful life; and FIG. 10 shows an exposed of the cartridge (N) of FIG. 1 on the fixed base.

FIG. 11 shows an example of an application in which the SPD protective device is of the single-phase (N, L) type, and FIG. 12 shows an application in which the protective SPD device is of the three-phase type (N, L1, L2, L3).

DESCRIPTION OF A PREFERRED APPLICATION OF THE INVENTION

A practical but not limitative application of the invention is a protective and monitoring device (10, 10', 10", 10''', 10'''') in which one of the cartridges (11) incorporates the component/s of the protection (20), the supervision means necessary for the supervision of the installation and the necessary indication means, for example by several LEDs (27) and disconnecting means (28).

Figure 1:
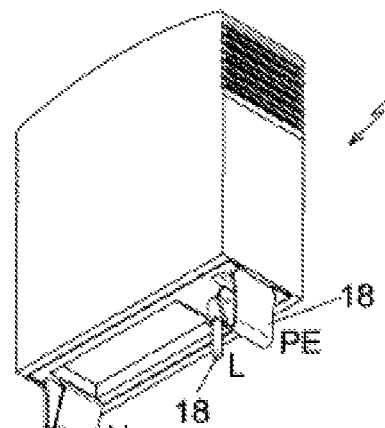
FIG. 1 shows a perspective view from the rear part of an eventual application of the external part of an N-PE cartridge.
Figure 2:
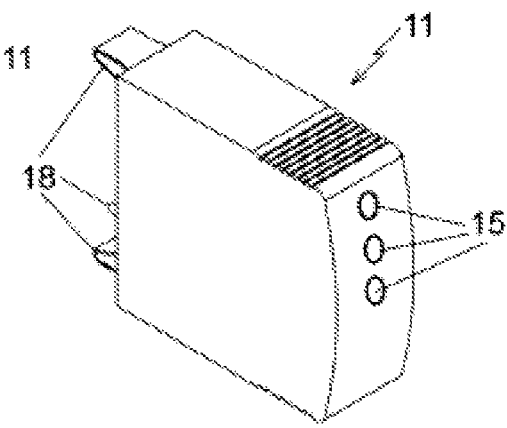
FIGS. 2 to 5 show front perspective views of the same cartridge as in FIG. 1 in different applications of possible types of indicators.
Figure 3:
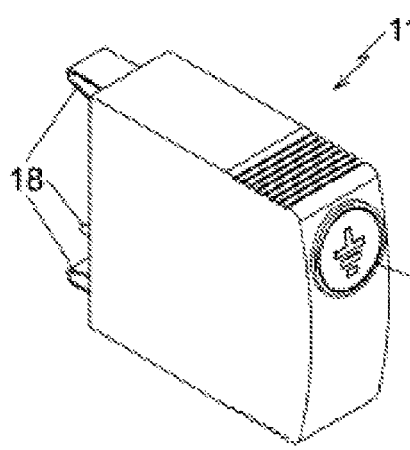
Figure 4:
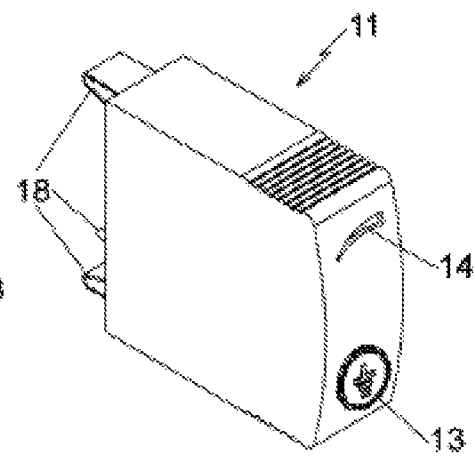
Figure 5:
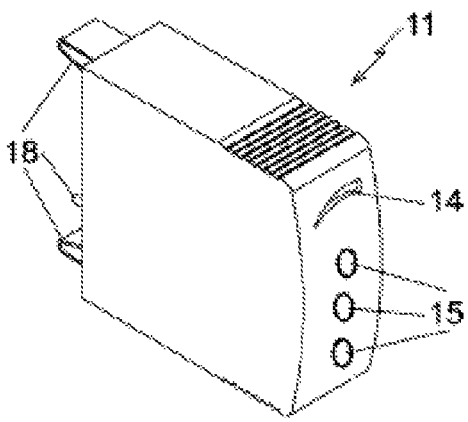

For example, FIG. 1 shows a cartridge (11) connected between N-PE, using as the protective component (20) a gas arrester or arc arrester, which is used as protection between N-PE of a single-phase and three-phase protective device in TT and TN-S systems. Said cartridge (11) has three connection terminals with the fixed base (18), connected respectively to line (L), neutral (N) and protective conductor (PE). In this case, the transient discharge current, normally of the order of kA, circulates in this case through terminals N-PE, and a lower current circulates through terminal (L), for which reason the cross section may be reduced.

Additionally other connection terminals may be added for protective devices, for instance three-phase devices in which it is necessary to know the voltages in each phase.

Added connection terminals can also be used to transmit the information obtained from the monitoring device and/or the end of life or status indicator of the protective component to the fixed base.

However, if needed due to installation requirements necessary, a varistor or another protective component can be used.

Figure 6:
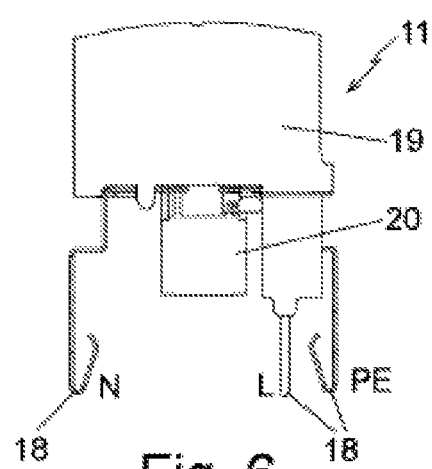
FIG. 6 shows a front view of the internal part of the cartridge of FIG. 1 with three connection terminals to the fixed base (N, L, PE).

FIG. 6 shows the layout of the electronic circuit (19) that integrates the monitoring means and the double protective component/s (21) in one of the cartridges (11), which in this particular example determine: the value of the impedance from the PE terminal to earth, if there is voltage in the earthing system that could be dangerous, if the supply voltage of an AC or DC network $V_L$ falls within normal limits, i.e. if the $V_L$ is between $V_{Lmin}$ and $V_{Lmax}$ and if there are any errors in the SPD device connection or wiring installation, indicating to the user the situation. If desired, optional means can also be included to indicate that the protective component has reached the end of its life.

The above indication of these parameters is preferably carried out by several LED diodes (27), of different colours, that can be fixed or flashing to allow the user to correctly interpret the situation, for example with three or four diodes. See the different configurations in FIGS. 2 to 5.

Figure 13:
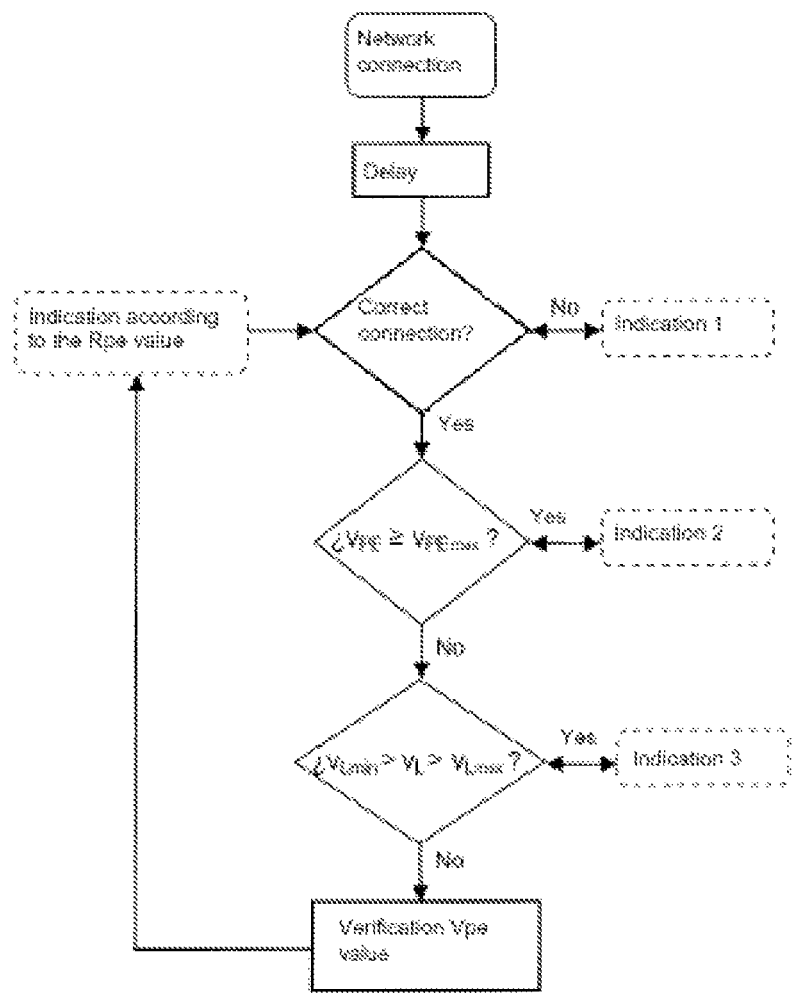
FIG. 13 shows a flow diagram of the different stages and activation conditions in a different way to those of the first indicator, for example giving a type 1 indication, type 2 indication and type 3 indication, with each of the indications being in a different colour.

FIG. 13 shows the order of operation of the various stages and activation conditions in a different manner from the first indicator light, for example giving an indication 1, indication 2, indication 3 and an indication depending on different $R_{PE}$ values:

Stage 1 (optional): when connecting the power to the monitoring circuit, there may be a delay before performing the different tests, with the main objective of allowing voltage in the electronic circuitry of the device to stabilise, in order to prevent a false failure indication.

Stage 2: if the network connection is incorrect→Indication 1 is activated.

Stage 3: if the voltage in the earthing system $v_{PE} \geq v_{PEmax}$→Indication 2 is activated.

Step 4: if the mains voltage ($v_L$) has a value such that $v_{Lmin} > v_L > v_{Lmax}$→Indication 3 is activated.

Figure 7:
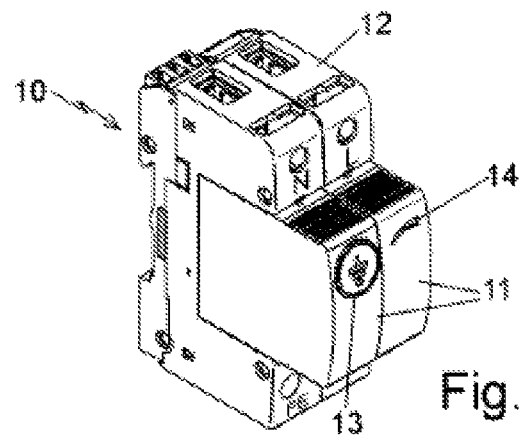
FIGS. 7 to 10 show front perspectives views of a first preferred application of the protective and supervision devices of the present invention formed by one or more plug-in cartridges on a fixed base.
Figure 8:
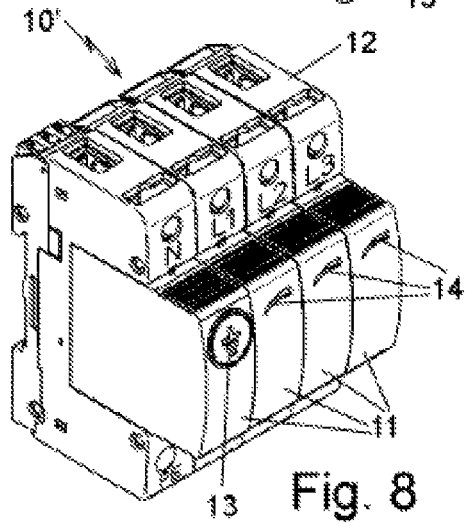
Figure 9:
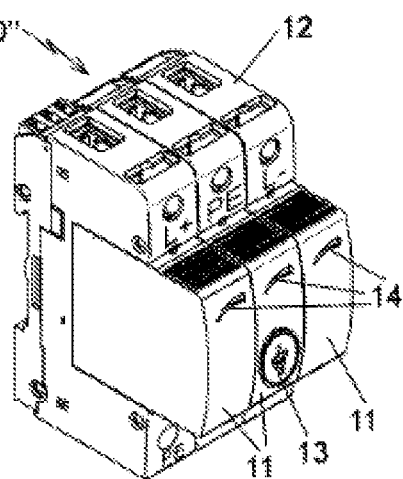
Figure 10:
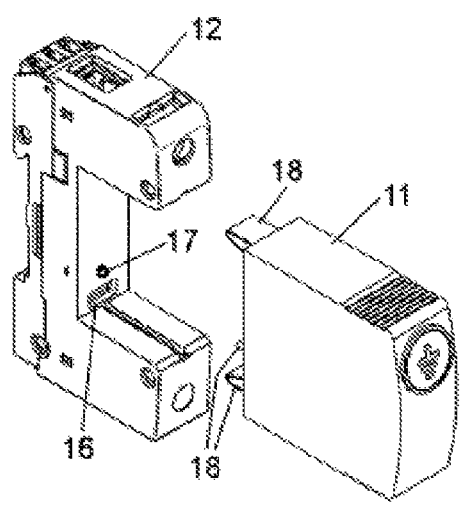
Figure 11:
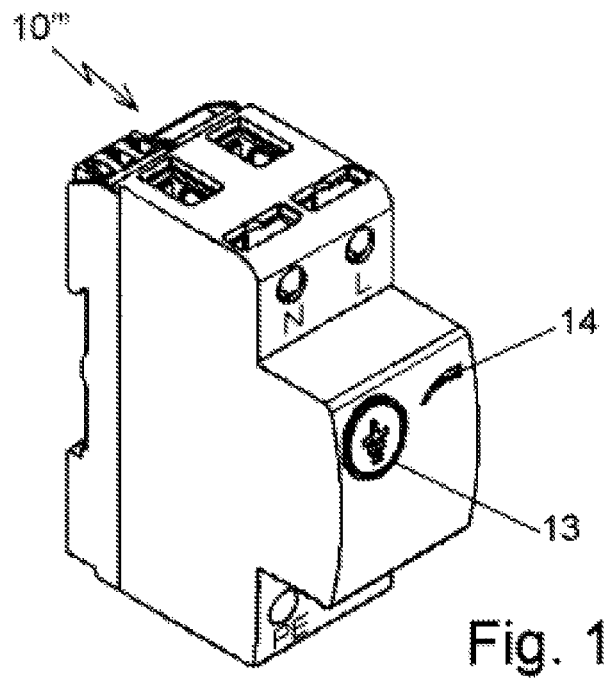
FIGS. 11 and 12 show the respective front perspective views of a second preferred application of the protective device forming the subject matter of the invention, formed by a compact or uniblock SPD.
Figure 12:
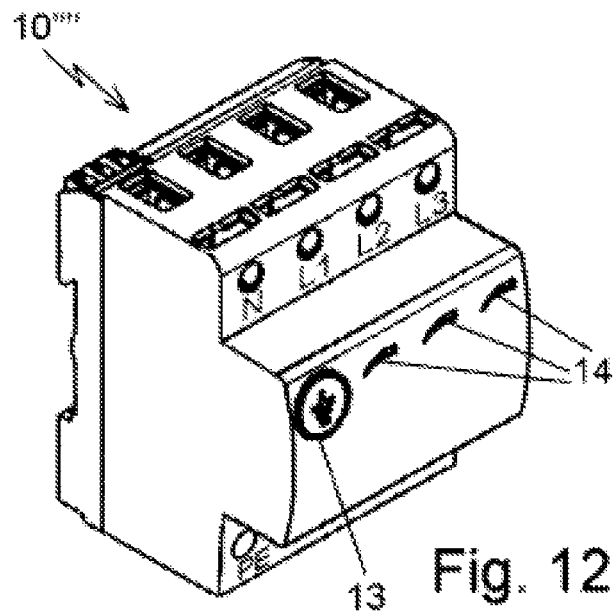

Stage 5: if all the above conditions are correct, then the same visual indicator (in the case of FIG. 7) gives the corresponding indication according to the $R_{PE}$ value obtained within the 4 preferred $R_{PE}$ value margins:

Margin 1: $R_{PE} < 30$ Ω
Margin 2: $30$ Ω $\geq R_{PE} < 60$ Ω
Margin 3: $60$ Ω $\geq R_{PE} < 600$ Ω
Margin 4: $R_{PE} \geq 600$ Ω

The indication corresponding to $R_{PE} \geq 600$ Ω clearly indicates a dangerous situation in the facility, as it means the earthing system is in an open circuit.

To determine the value of the earthing system impedance ($R_{PE}$) in step 5, the monitoring means inject current impulses to earth through the PE terminal.

If any of the checks in stage 2, stage 3 or stage 4 are incorrect (i.e. the connection, the earth system voltage ($v_{PE}$) or the value of the network voltage ($v_L$), then the system stops at that point and checks it regularly (preferably every few seconds). Once the failure has been corrected, it proceeds to step 5 of the impulse injection. If the process does not stop, the values obtained in the monitoring of the earthing system impedance in Step 5 would be incorrect.

Internally, the first lighted indicator is formed, in accordance with a possible application, by a series of LEDs in different colours, depending on the type of indication, with some or others lighting up, depending on their status. In addition said LEDs can be fixed or flashing.

To determine the value of the earth system impedance ($R_{PE}$) or earth voltage ($v_{PE}$), it is not necessary to use means with a very high degree of sophistication, since for the specific implementation of this invention, the applicant has found that it is sufficient with values having an accuracy of less than 10%. Thus it is possible to obtain a device for the protection and monitoring that is both small and has a low cost. With this degree of accuracy, the visual indications given to the user have ample safety margins.

The means for determining the value of the impedance of the earthing system ($R_{PE}$) or earth voltage ($v_{PE}$) are based on the application of current impulses to earth via the PE terminal using the phase-earth loop. These impulses meet a number of requirements:

They are of sufficiently high intensity to determine the voltage increase in the earthing circuit, but in turn must not cause the actuation of the possible residual current circuit breakers in the circuit, nor should they cause a malfunction in the residual current circuit breaker at long term.

Long term malfunctioning of the residual current circuit breaker can happen for several reasons. The RCD contain sensitive magnetic components with a degree of magnetisation adjusted by each manufacturer and which depends on its sensitivity to detect the difference of AC currents between conductors that cross it. If current impulses of a single polarity are applied with a high repetition rate, e.g. in each cycle or half cycle of network, such as in the ES2266761 patent or trains with large numbers of impulses, such components may be magnetised/demagnetised permanently in the long term (a few years) and their malfunction is not detected until there is a fault in the installation. The user could periodically check the operation of the RCD, as indicated by their manufacturers, but this is rarely, mainly in household environments.

All these requirements described can be met largely by using current impulses of a small value, with a very small number of impulses in the injected bursts and a very low burst repetition frequency (which is variable and controlled from some seconds to several minutes).

Other known systems today employ currents and frequencies with a much higher repetition to reduce the influence of noise and obtain a reduced accuracy value for very low impedances, in which the increase of voltage in the earthing system caused by the injected impulse is very low. These features are not only unnecessary in the device forming the subject matter of the invention but would also be counterproductive. The claimed protective and monitoring device is not essentially a measuring instrument, but a protective device that includes means to permanently monitor the most important parameters during the facility installation, operation and maintenance processes, in addition to alerting the status of the installation and of the device itself.

When determining the impedance of the earthing system it must also be considered that this does not generally have a purely resistive component, and depending on the state of the installation, it will also present inductive and capacitive components. However, as the monitoring means are preferably installed in the device, the key components are normally resistive and capacitive, since the SPD device is installed in the origin of the installation and the wiring length is reduced and is specifically executed to minimise the inductive effects that it could introduce.

Therefore, the applicant has concluded, after several tests, that the duration of the current impulse ($T_{imp}$) must be long enough to not be affected by the capacitive component of the impedance in the measurement of the voltage increase. The monitoring circuit used by the present invention is provided to obtain an accuracy lower than 10%, having capacitive components as high as 10 µF, but they are generally much lower.

Through numerous experimental tests of repeated measurements in different types of facilities, the applicant has finally determined that the preferred values of the duration of the current impulse ($T_{imp}$) are between $200 < T_{imp} < 300$ µs. The tests made by the applicant in different types of RCD devices, both new ones and devices installed for many years, suggest that this range of values is more desirable for optimum results with earthing system impedances that have high capacitive components. However, other values could be used for the $T_{imp}$ application of this invention, without changing the essence of the invention.

The value of the earthing system impedance (based on the above considerations, only its resistive $R_{PE}$ value may be considered) is obtained by determining the voltage increase caused by the injected impulse current with regard to the voltage in the earthing system (this voltage is variable over time, normally at the same frequency as the supply voltage and may have a sufficiently high value to alter the result of the $R_{PE}$ measurement if not considered), the measurement of the increase in the earthing system voltage is carried out in the last microseconds of the injected impulse to minimise the influence of capacity and/or inductance that may exist. Considering the duration values of the impulse current ($T_{imp}$) indicated above, the values of the voltage increase have stabilised sufficiently to meet the accuracy requirements.

Another requirement to be met by the circuit that conforms to the monitoring means is to indicate whether the mains voltage ($v_L$) is within the operating range of the SPD device and the monitoring circuit. In most countries, the standard voltage margin tends to be between +10%-15% of the rated voltage, so when sizing the SPD device, a Uc value that is 15-20% higher is normally used ($v_{Lmax}$) at the rated voltage ($v_{Lnom}$). This prevents the SPD from conducting for the maximum voltage values of the mains voltage and becoming permanently damaged. If the voltage value ($v_L$) is less than the minimum value indicated ($v_{Lmin}$), the monitoring circuit can give incorrect indications, and the operation of connected loads and installation equipment may also be affected; if the voltage value is higher than the SPD Uc, the life of the device is reduced or it may be permanently damaged, also affecting to the equipments and loads connected downstream of the SPD. The voltage ranges indicated are considered the preferred ones, as they are those most commonly used, but different values may be used if deemed necessary.

Figure 14:
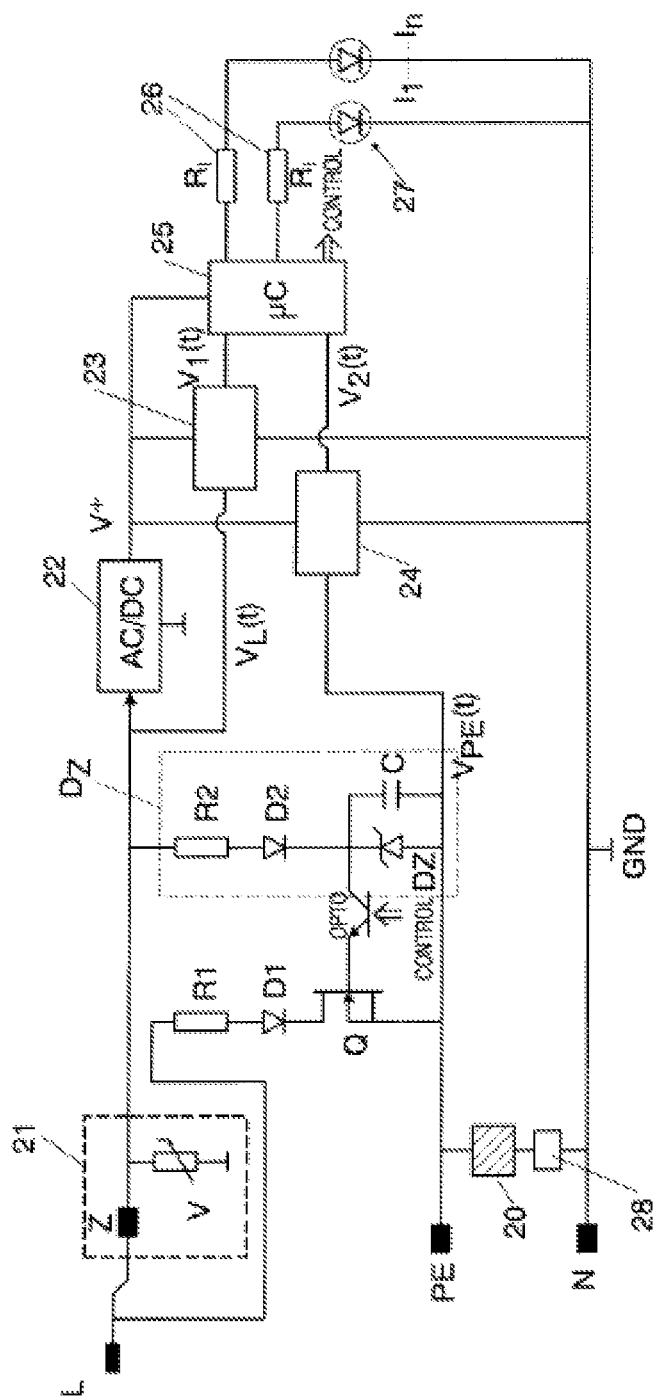
FIG. 14 shows a block diagram of the electronic circuit for the supervision means of the invention together with the protective component located inside the cartridge.
Figure 15:
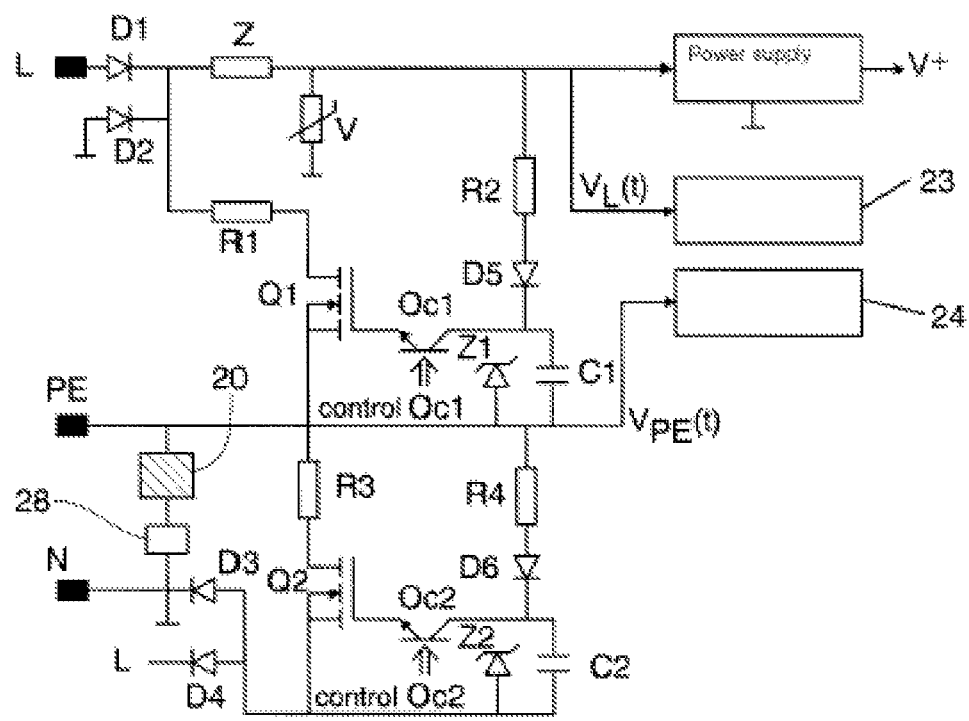
FIG. 15 shows a simplified diagram for the injection of positive and negative impulses.

The protective and monitoring function of the present invention is preferably performed according to the electronic circuit scheme shown in FIG. 14. In this example the AC/DC (22) converter supplies a DC voltage $V^+$ from the common circuit point (GND), which is connected to terminal (N) of the cartridge. This AC/DC (22) converter must comply with strict requirements in terms of performance characteristics, its line regulation must be very high because the AC input voltage margin is high. It must also be able to withstand temperature margins ranging between −40° C. and +80° C. (which are the usual margins for SPD devices) and regulate the V+ voltage correctly, since this voltage depends on the correct result of the voltage measurements. The $V^+$ voltage is used to power the controller (25) and adapters (23) and (24). The output voltage of these adapters (23) and (24) provide the controller (25) with DC voltage, normally V+/2, for a maximum dynamic range and a superimposed AC voltage in proportion to their input voltages:

$$v1(t)=V^+/2+k1 V_L(t) \quad [1]$$

$$v2(t)=V^+/2+k2 V_{PE}(t) \quad [2]$$

Hereafter the time-dependent variables ($v_1$ (t) and $v_2$ (t)) shall be indicated only with the letter of the variable and in the lower case.

Adapters (23) and (24) are composed of passive and/or active devices, further allowing the possibility of filtering high frequency components (generally noise and/or harmonics) that may come from the $v_L$ voltage network or the $v_{PE}$ earthing system voltage. The parameters $k_1$ and $k_2$ in the above equations [1] and [2] can represent both a gain and an attenuation of signals $v_1$ and $v_2$, and may or may not be dependent on the frequency (filter). $k_1=k_2$ and are normally<1. In certain applications, it may be necessary for the adapter (24) to amplify the $v_{PE}$ voltage so $k_2$ would exceed $k_1$.

As shown in the diagram of FIG. 13, based on the voltage in L, N and PE the circuit detects whether the wiring connecting the SPD device or installation is correct, e.g. the $V^+$ voltage is a positive voltage regardless of whether the L and N connection is correct or interchanged, and at this point the circuit can measure the $v_1$ voltage (obtained from $v_L$) and $v_2$ voltage (obtained from $v_{PE}$) and determine whether the L− N connection is correct or not ($v_L-v_{PE} \cong v_L$ and voltage $v_N-v_{PE} \cong 0$). If the result of this check is correct, the monitoring process continues, otherwise, the circuit gives an indication of this failure and the situation is checked periodically every few seconds until the fault has been corrected.

If the result of the above check is correct, the device then checks the $v_{PE}$ voltage, and if it is less than the maximum value set (preferably in the range from 20V to 40V) the monitoring process continues, otherwise the circuit gives the indication of this failure, checking the situation periodically every few seconds until the fault has been corrected.

The process continues to determine the value of the voltage by voltage value $v_1$, which is proportional to $v_L$. If this value is within the range $v_{Lmin} \leq v_L \leq v_{Lmax}$ the monitoring process continues, otherwise the circuit gives an indication of this failure, checking the situation regularly (preferably every few seconds) until the fault is corrected.

When all checks are successful, then it proceeds to the injection impulse on the PE terminal to determine the earthing system impedance value. However, the above checks are still carried out regularly. Even so, in certain cases the non-interruption of the process may be partially assumed, despite the existence of faults, for example, if the wiring is correct but the system voltage earthing is higher than that set, it could indicate this fault, but continue measuring the voltage to ensure it is within the correct margins. However, it would be advisable not to inject current impulses in the earthing system.

The method indicated in FIG. 13 represents an advantage in terms of the safety of the installation or users with respect to other known devices. In the device of the invention, it is provided, optionally, that when the power is connected, there is a time delay before the different tests are performed. Previously it was indicated that one of its objectives was to permit the stabilising of voltage in the electronic circuitry of the device, to avoid false failure indications, and another goal is to prevent anything from interfering with the operation of the RCD device when connecting the AC supply voltage.

The protection and monitoring uses the $v_1$ and $v_2$ signals respectively (which are proportional to the $v_L$ and $v_{PE}$ signals) to determine the earthing system impedance value ($R_{PE}$). This process is performed by injecting a impulse in a positive half cycle, but it is preferably repeated up to 4 times in consecutive half cycles (bursts of 1, 2, 3 or 4 impulses, injected continuously and always containing the same number of impulses). See FIG. 16. The $v_{PE}$ voltage increase caused by the current impulse allows the earthing system impedance to be obtained for each unit impulse applied. It takes as the earth system impedance that obtained for each burst, this being determined preferably by the average value obtained for each unit impulse. The reason for this to minimise the influence of variations that may exist in $v_1$, and/or $v_{PE}$ voltage and/or noise present on the network and the value obtained is used when giving the indication to the user (27) or other possible warning signs if deemed necessary.

As indicated above, the process is repeated continuously, and continuous impulse bursts are applied, with a separation between them, preferably of between several seconds and several minutes. The separation between bursts ($T_r$) will be depend on the stability obtained in the earthing system impedance measurement (since the power dissipation of the circuit is very low with the method used). For example, when the power is connected, a separation of a few seconds can be used, and then gradually increased to several minutes, when it remains stable, unless variations are detected, such as a higher impedance, preferably between 10-20% from one burst to the next, in which case the separation between bursts is reduced. These variations may be caused for example by breaking the connection between the SPD device and the earthing system and/or by noise or fluctuations in $v_L$ and/or $v_{PE}$ signals, since as indicated above, impedance changes take place very slowly (significant changes in the temperature and/or humidity of the soil).

Using multiple measurements on different types of installations, it has been found that this number of impulses per burst and the indicated separation between bursts are sufficient to obtain the required accuracy within the established margins. The value margins indicated are considered the preferred ones, but different values may be used for the number of impulses per burst and the separation between them if deemed appropriate, without altering the essence of the invention. However, it has become apparent that it would be desirable to use the minimum number of impulses possible, which greatly reduces the probability of the unwanted actuation of the RCD, possible interference in the operation of sensitive equipment connected to the network and the premature ageing thereof due to changes in the magnetisation of the components incorporated into the RCD.

Figure 21:
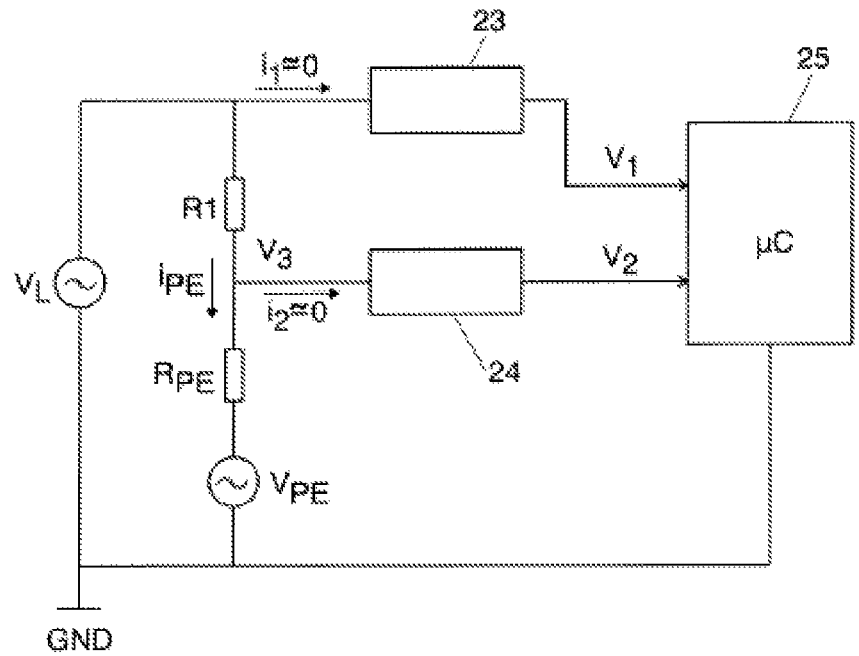
FIG. 21 shows the equivalent circuit when the MOSFET Q conducts.
Figure 22:
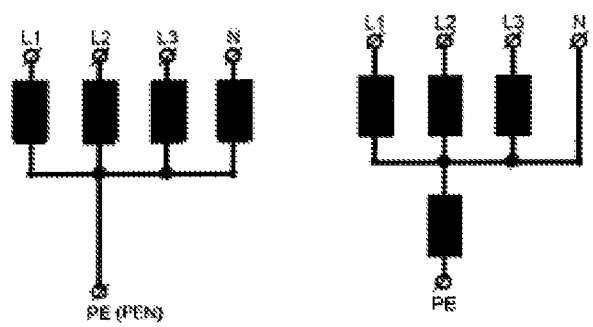
FIG. 22 shows the two types of connections, depending on the system configuration of the three-phase power mains.

The process continues by determining the zero passage of the $v_L$ voltage from the negative half cycle to the positive one. This signal is taken as a 0° reference of the AC voltage network, and the impulse is preferably injected at an θ angle between 90° and 150°. To that end, the controller generates an impulse with a duration $T_{imp}$ that turns on the MOSFET transistor (Q). Under these conditions, the equivalent circuit is shown in FIG. 21.

Whereas the adapters (23) and (24) have an input impedance that is high enough to get currents $i_1$ and $i_2 \ll i_{PE}$, the following equation is obtained:

$$i_{PE}=v_L-v_{PE}/R_1+R_{PE}=v_3-v_{PE}/R_{PE} \quad [3].$$

In this equation [3] $v_3$ is the voltage in the terminal PE of the SPD when the current impulse is injected. The indicated $v_{PE}$ value generator is the earth voltage when the impulse is not injected, normally is a voltage at the same frequency as the network but in normal conditions of a reduced value.

$v_L$ is determined from the measurement of the voltage $v_1$ and $v_3$ from the $v_2$ measurement, with $R_1$ being known and established by design to limit the injected current to earth through Q. As $R_{PE}$ and $v_{PE}$ are unknowns, if is possible to determine the value of $v_{PE}$ the $R_{PE}$ value can be determined by calculation in the controller.

It is possible to obtain a very approximate value of $v_{PE}$ by measuring its value a few microseconds before injecting the current impulse and this value can be used in equation [3], since the duration of the applied impulse is very short and it can be considered that $v_{PE}$ is about the same value as during the measurement of $v_L$ and $v_3$. These two variables are measured during the last microseconds of the current impulse, so that the voltage $v_3$ is stabilised, thus preventing the effect of the capacitance and inductance of the earthing system. It should also be considered that the $v_L$ and $v_3$ measurements are made simultaneously, so that a possible variation in the network voltage will not affect the measurement result. Thus, a value of $R_{PE}$ with the adequate accuracy required by the monitoring system is obtained that is largely independent from the existence of voltage in the earthing system, variations or noise in the network voltage, and high capacitance or inductance in the earthing system.

There is one more factor that has not been considered until now, namely to avoid increased corrosion problems in the earthing system caused by electrolysis. This phenomenon is increased by the injection current with a DC component, it is true that the average current values used (evaluated in years) are small but they increase the corrosion process that occurs in the electrodes and the means of interconnection with the earthing conductor. The electrolysis is further increased by moisture but precisely is convenient that the earth electrodes installation remains moist. This type of corrosion is significantly attenuated by using protective conductors, earth electrodes (usually rods) and interconnecting pieces of the same material. This situation occurs very rarely. The materials used in the earthing installation are usually copper for the protective conductor and for the electrodes and interconnecting pieces, iron or galvanized steel, stainless steel, and copper coated steel.

The first two types (iron or galvanized steel and stainless steel) are those most commonly used for the electrodes and interconnecting parts, which are those most affected by corrosion. More and more often, steel electrodes are used with different copper coating thicknesses, making them more resistant to corrosion. However, the manufacturers of these materials and installers who inspect the earthing system find that their length is significantly shorter than forecasted. One of the influencing factors that is not usually considered is continuous earth leakage in the installation, which increases considerably with the mass incorporation of electronic equipment in all types of facilities.

It would not be wise to install a system to monitor the status of the earthing system that accelerated its corrosion, as it injects current impulses with a continuous component, and it is always necessary to bear in mind that it must evaluate the behaviour of the set for many years: SPD with monitoring device+RCD+earthing system installation.

In summary, the protective and monitoring circuit must inject the smallest possible number of impulses with the minimum amplitude of current possible to obtain the adequate accuracy for the product under consideration. To this end, the present invention uses a method for controlling the dynamic current impulse injection angle, depending on the AC supply voltage, the earthing system resistance and the stability of the measurement taken.

The process for injecting a minimum current value so that the required accuracy is obtained is by injecting the current impulse preferably an angle $\theta \geq 90°$ and $\leq 150°$ of the voltage of each positive half cycle of the unit comprising the burst, thus reducing the injected current as the value θ increases to a value of 50% of the maximum value (sin 150°=0.5). It should be noted that whenever possible it is necessary to avoid injecting impulse areas in areas close to 90°, because at such points the filter capacitors used in power supplies with input network voltage rectifiers are recharged. Although the increase in voltage caused by the current impulse is small, its frequency spectrum is high, since current impulses in microseconds and with much smaller rise/fall times are injected, the high frequency components could eventually affect the controller if it is not correctly designed. The θ angle is controlled depending on the $v_L$ voltage network; for $v_{Lmax}$ an angle θ of 150° is preferably used and for $v_{Lmin}$ θ a 90° angle is preferably used. For intermediate values of $v_L$ it is preferable to adjust the angle θ in a linear way, and other criteria may be used if appropriate.

The θ angle control is set individually for each of the impulses of the burst, since $v_L$ may vary from one half cycle to another. For this purpose the circuit determines the zero passage of the voltage of the negative half cycle to the positive as reference θ=0°, and determines the value of $v_L$ as 90° and depending on that value it applies the impulse at the angle. As a numerical non-restrictive example for a nominal voltage network $v_{LNOM}$=230V±15% the following equations are obtained:

$$v_{Lmax}=264.5 \text{ V} \rightarrow v_L(90°)=374 \text{ V} \rightarrow θ=150°$$

$$v_{Lmin}=195.5 \text{ V} \rightarrow v_L(90°)=276 \text{ V} \rightarrow θ=90°$$

$$v_{Lnom}=230 \text{ V} \rightarrow v_L(90°)=325 \text{ V} \rightarrow θ=130°$$

The injection of the impulse at an exact angle is not a critical aspect, as when measuring $v_{PE}$ and $v_L$ voltages simultaneously, they do not the changes in the sinusoidal signal in the half cycle, and neither do they have any noticeable effect on the fact that a superimposed noise may exist in measuring the voltage at 90° that affects its value and applies a phase angle that is different from the one calculated since θ is bounded between 90° and 150° and besides, resistance $R_{PE}$ is obtained by averaging the value obtained for each individual impulse of the burst, which tends to cancel out any errors.

From the standpoint of the user, we should also consider that the indication of the earthing impedance values in the cartridge is preferably done by value margins using LEDs. A series of $R_{PE}$ margins that have been shown to be suitable are:

Margin 1: $R_{PE}$<30 Ω
Margin 2: 30Ω≤$R_{PE}$<60 Ω
Margin 3: 60Ω≤$R_{PE}$<600 Ω
Margin 4: $R_{PE}$≥600 Ω

Margin 4 clearly indicates a dangerous situation in the installation because the system would understand that the system is an open circuit.

On the contrary, margin 1 indicates that the impedance is suitable from the point of view of safety and the effectiveness of the transient overvoltage protection.

The number of $R_{PE}$ margins, the value of the $R_{PE}$ margins and the number of indicators and indications can be modified and adapted according to the specific needs of the protection and supervision device, so using different ones will not alter the essential nature of the present invention.

The above process is also completed by using the $R_{PE}$ value obtained in each burst. In other known devices higher values are generally used in the current impulses and it should be noted that with very low levels of $R_{PE}$ the voltage increase resulting from the impulse is reduced and, therefore, likely to be affected by noise. This is not necessary in the circuit of the invention with $R_{PE}$ resistances exceeding tens of ohms, since the voltage increase caused by the impulse current in the system earth is high enough to not be significantly affected by noise. However the operation can be improved for small $R_{PE}$, because the circuit includes adapters (23) and (24), which can amplify the corresponding signals, filter and, for example, enter a variable gain, depending on the voltage level input to prevent damage to the controller (or limit the output voltage level).

This means that the decision criterion for adjusting the injection angle θ in each half cycle of the burst based on the value of the voltage $v_L$ θ=90° is preferably modified depending on the value of $R_{PE}$ obtained for the previous burst, so that as the $R_{PE}$ θ value rises, the current value 0 is increased to reduce the current further, and vice versa.

For example, the mean $R_{PE}$ value obtained could be used for several prior bursts to make the system more stable as it has already been indicated that under normal conditions, $R_{PE}$ changes slowly and seasonally throughout the year.

A sudden change between one burst and the next occurs in the event of an interruption in the earthing system, due, for instance, to the disconnection or failure of the earthing system somewhere on its path, and this would be detected by the circuit because the process of applying the bursts is indefinite unless an error is detected in the connection, if $v_{PE}$ is higher than the established value or if $v_L$ were out of the correct margins. Once these problems have been solved, the circuit would continue with the impulses injection.

Another factor to be considered in the present invention when controlling the θ angle is the stability of the $R_{PE}$ value obtained from one burst to the next. One of the preferred criteria used is as follows: if between one burst and the next there is a variation in $R_{PE}$ of more than 10-20% θ and/or $T_r$ will be gradually reduced to increase the level of the injected current, obtain greater in $v_{PE}$ voltage increases and check more quickly whether there has been a change in the current $R_{PE}$ or whether it was due to a perturbation in the mains voltage. Thus the effect of any noise or existing variations in $v_L$ and/or $v_{PE}$ voltages is reduced, as it has been detected that the stability in determining the $R_{PE}$ value is within the ranges indicated and θ and/or $T_r$ will be modified, based on $v_L$ and $R_{PE}$.

Another criterion that can be applied is to use the change of status in the $R_{PE}$ indicators so that in the event of a change in status of the indications, minimum θ and $T_r$ values are applied. This will increase the sensitivity of the system and the indication will be updated more quickly.

These criteria or methods described are given as a guideline, but others could be used without changing the meaning of the invention.

We should consider that with the θ margin indicated (90-150°), accuracies below 10% were obtained in determining the resistance of the earthing system, and θ values higher than 150° could be considered if greater accuracies were admitted.

The present invention aims to inject the smallest possible number of current impulses with the lowest possible value.

However, it can be considered that the development of a controller with such types of control may increase the cost of the circuit, either due to the characteristics of μC or due to the software development time required. Therefore, the decision could be taken to use only one of the above criteria, for example varying the θ angle based only on the value of $v_L$ or $R_{PE}$.

Figure 19:
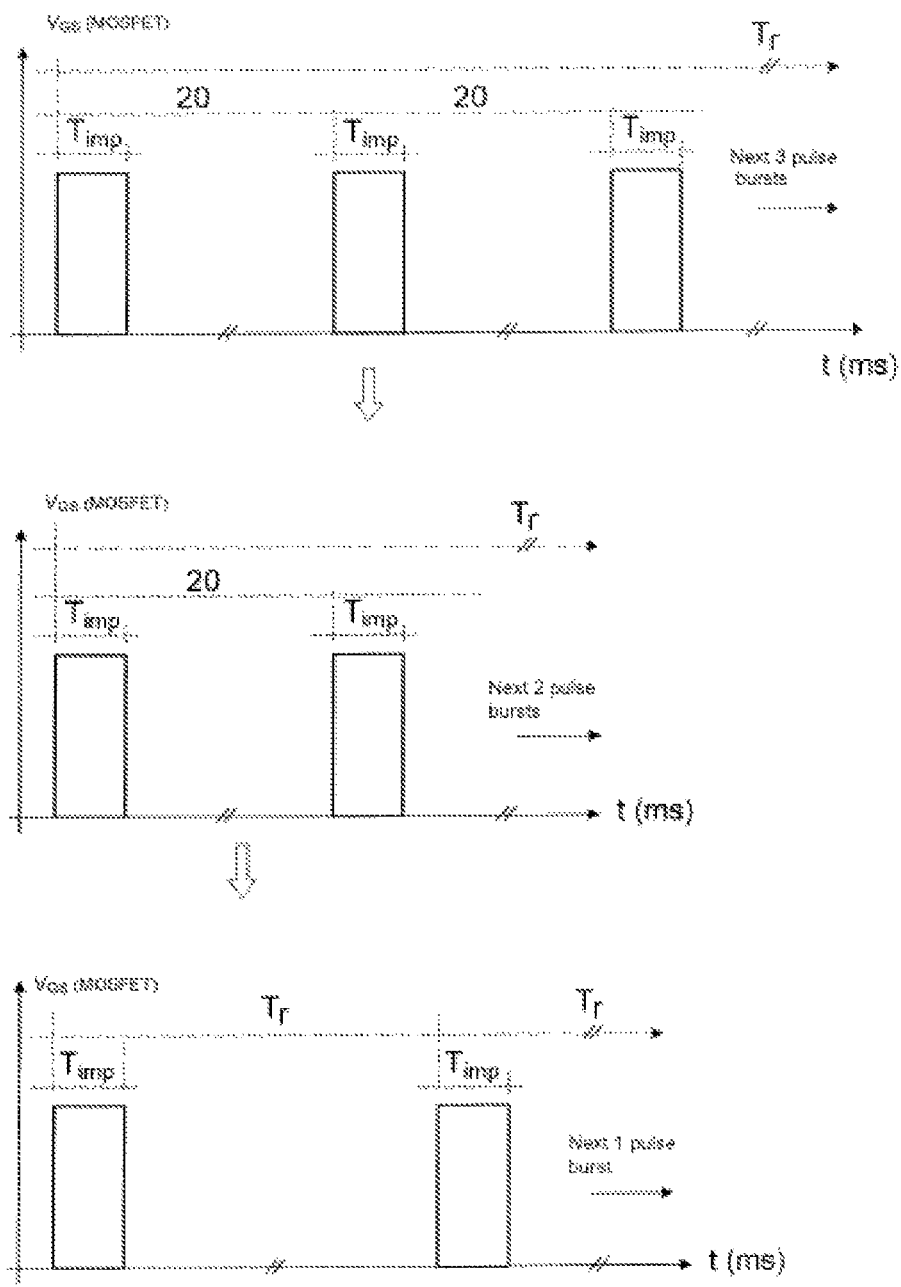
FIG. 19 shows the stages for the reduction of the injected current by decreasing the number of impulses per burst, provided the stability of $R_{PE}$ is satisfactory, maintaining the width of the impulse for the bursts. In this case, for example, initially 3 impulse bursts are used, which could afterwards change to two impulse bursts and then one impulse if the stability of $R_{PE}$ is satisfactory. The output impulses from the controller are adapted to the necessary gate-to-source voltage ($V_{GS}$) for the conduction of the MOSFET. It is during this time when the current impulse is injected. In all of the stages, the width of the impulses ($T_{imp}$) as well as the separation between bursts ($T_r$) is maintained.
Figure 20:
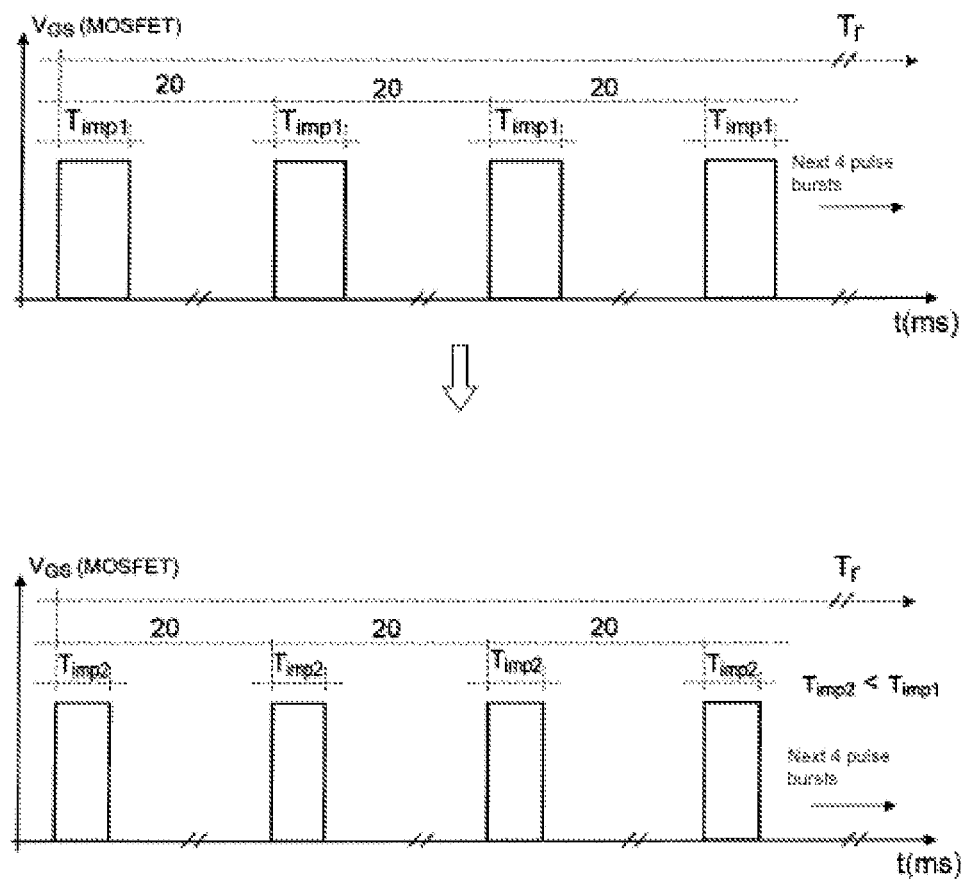
FIG. 20 shows the reduction stages of the duration of the impulses ($T_{imp}$), provided that the stability of $R_{PE}$ is satisfactory. In this case, for example, bursts with 4 impulses are used with an initial duration $T_{imp1}$, which may be reduced to a shorter duration $T_{imp2}$ (that is $T_{imp2} < T_{imp1}$). The output impulses from the controller are adapted to the necessary gate-to-source voltage ($V_{GS}$) in order that the MOSFET conducts, and during this time the current impulse is injected.

Other criteria that could also be applied in order to reduce the average current injected into the earthing system are the following:

The progressive decrease in the number of impulses per burst, as long as this fulfils the criterion that the stability of $R_{PE}$ is satisfactory, keeping the pulse width ($T_{imp}$) for the blasts. For example, in FIG. 19 pulse bursts of 3, which could then become two impulse bursts and then 1 pulse burst, depending on the stability of $R_{PE}$.

Figure 16:
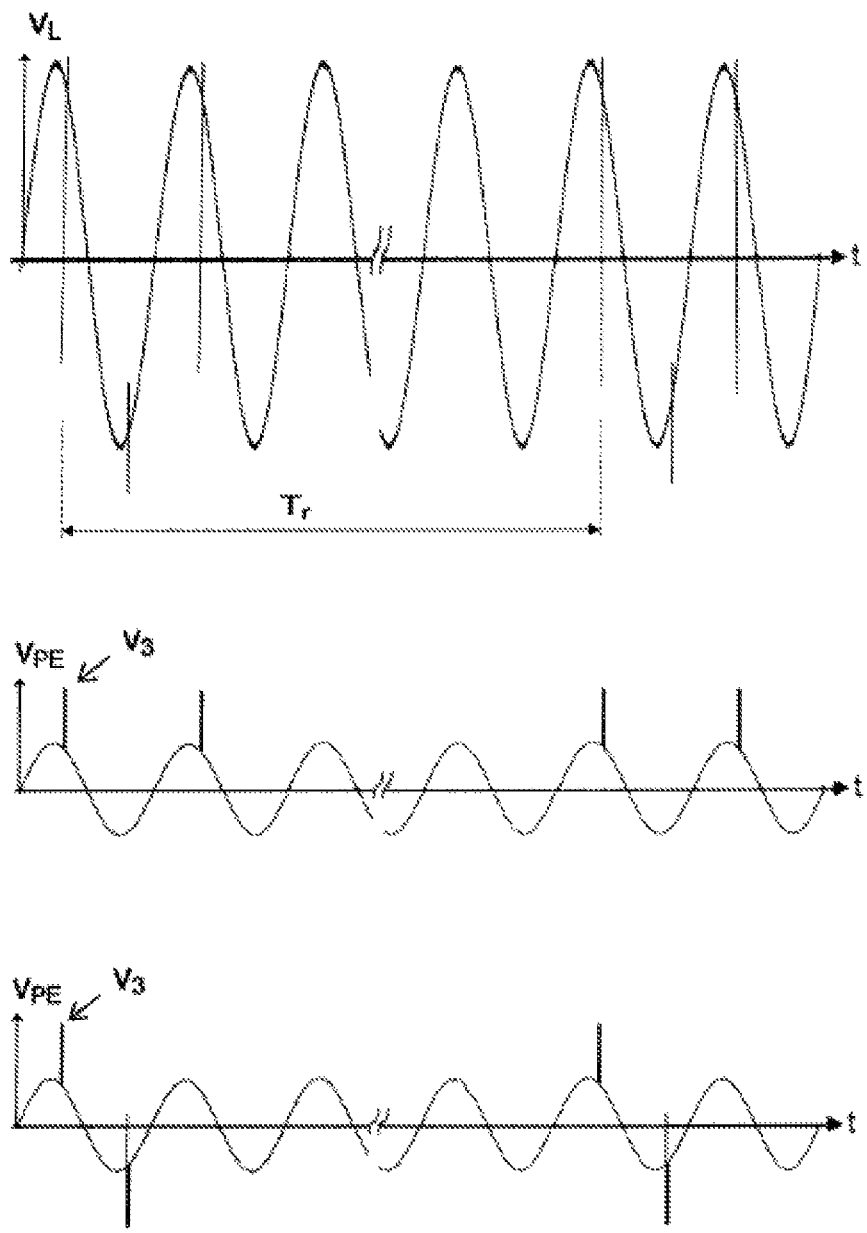
FIG. 16 shows examples of a 2 impulse bursts; in the second diagram the case is shown of bursts by 2 positive impulses, and the third diagram shows the case of bursts of one positive impulse and one negative impulse in which the variable "$T_r$" is the time lapse between bursts.
Figure 17:
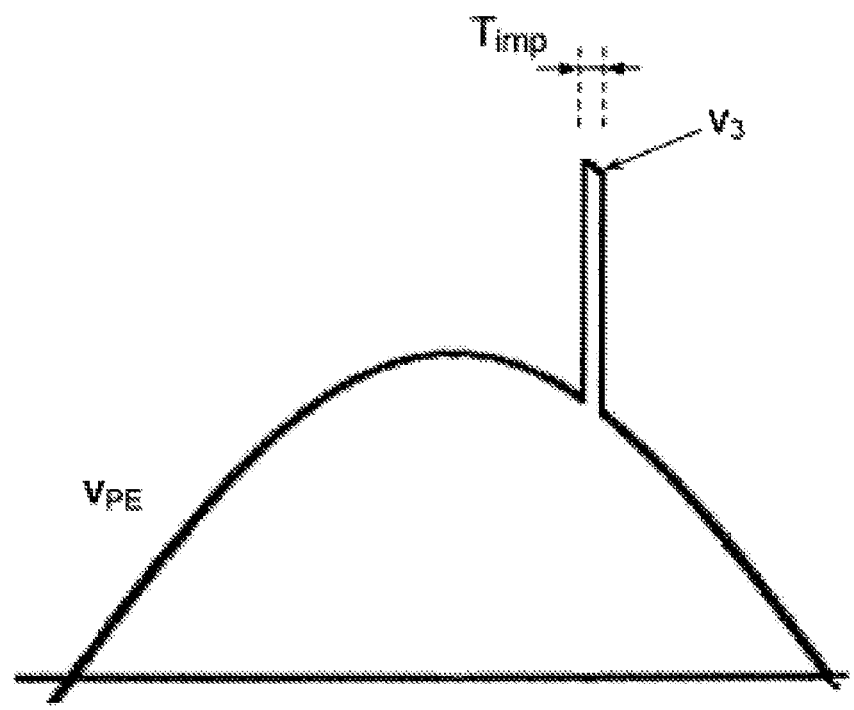
FIG. 17 shows a detail of a impulse in a positive half cycle, in which the variable "$T_{imp}$" is the duration of the impulse.
Figure 18:
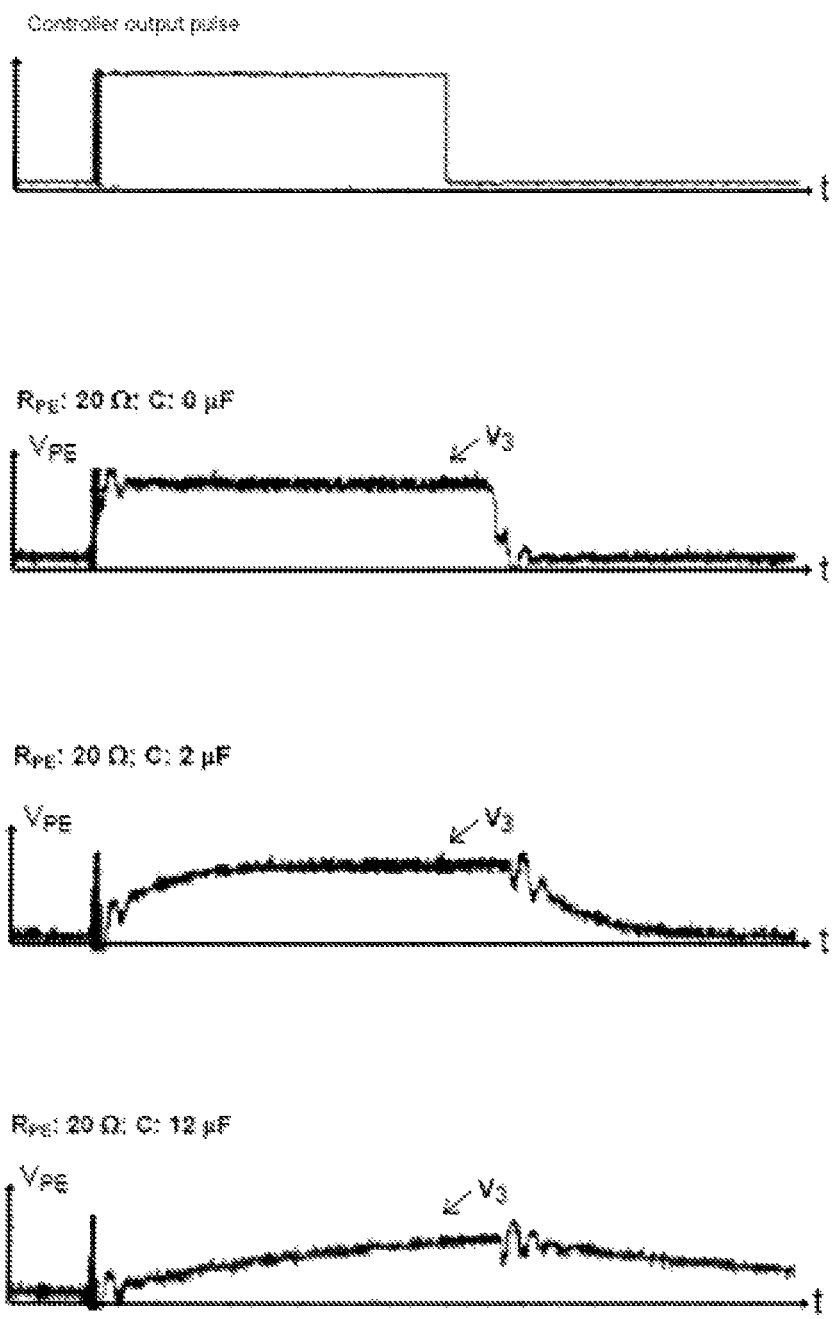
FIG. 18 shows diagrams in which the effect of the capacity in the $v_{PE}$ signal is shown. The last diagram is for a capacity of 12 μF and it shows that there is an error. For this reason, the maximum capacity of the PE system considered is about 10 μF.

The use of current bursts with a mean value of approximately zero current, i.e. injecting current impulses of different polarities in each half (for example in FIG. 16). With this system, the problems caused by the injection current with the DC component are avoided. In this case, a reduction in the number of impulses could also be applied.

Reduce the impulse duration ($T_{imp}$), preferably to 75% of the value initially used. It is not considered advisable to reduce it further to avoid measurement errors if the earthing system impedance is capacitive. Other values can be used without altering the essence of the invention. The $Ti_{mp}$ reduction can be progressive or instantaneous, but preferably the latter, to avoid complicating the development of the controller software and/or the need for a better performance.

When reducing the current, one, several or all of the above criteria can be applied. However, to prevent the system from inputting a stable but incorrect $R_{PE}$ measurement (it has been possible to reduce the injected current but the device could be more sensitive to noise or other unforeseen parameters) it is highly recommended (but optional) to perform a periodical "reset" on the measures, i.e. to return to the measurement situation with maximum sensitivity, apply impulses at 90° (regardless of the mains voltage and $R_{PE}$), minimum time between bursts, maximum number of impulses initially decided and duration of the initial impulse. From then on, the reduction criteria could be applied gradually. The time between "resets" is recommended to be a value between 12 and 24 h, although other values can be used at the discretion of the user.

Unlike other devices known to date, in the combined protective and monitoring device described in the present invention the current impulses injected into the loop come from the mains supply and are supplied by the means integrated into the cartridge (when conducting the Q transistor), so there is no need to use any type of battery. On the other hand, filter devices can be used on the adapter (23) and/or digital filtering in the controller software in the case of the present invention to reduce the potential error in the determination of the 0° step. In addition, the device of the invention will not only be noticeable affected by the angle of injection impulse, as it is variable and controlled.

The invention claimed is:

1. A combined device for electrical protection against transient overvoltages and monitoring of an electrical installation, as used in single-phase or multi-phase alternating voltage installations, which is formed by cartridges plugged to a fixed base or that is formed by a monoblock, comprising: a minimum of one protection group formed by one or more protective components protecting against transient overvoltages in each plug-in cartridge or in the monoblock, the one or more protective components being a varistor(s), gas arrester(s), gas discharge tube(s), spark gap(s), suppressor diode(s), triac(s), thyristor(s), and/or MOSFET(s); means of monitoring configured to permanently measure and process one or several parameters in relation to the condition of the electrical installation and the one or more protective components; and means of indication connected to said means of monitoring and set up in such a way as to indicate the following output parameter:

If an earth resistance value ($R_{PE}$) measured by the means of monitoring is inside or outside of certain predetermined limits or margins $R_{PEMIN}$ and $R_{PEmax}$; wherein the earth resistance value $R_{PE}$ measured by the means of monitoring is based on the injection of current impulses to earth via a PE terminal using a phase to earth loop and these impulses are of high enough intensity to determine the increase in voltage caused by the injected impulses with regard to voltage in an earth system, but without triggering a possible residual current circuit device(s) (RCD) which is/are installed in the electrical installation, or causing a malfunction of the residual current circuit device(s) in the long term;

wherein the means of monitoring uses a dynamic method to control an angle of injection of the current impulses, depending on the AC supply voltage, and/or resistance of the earth system $R_{PE}$, and/or the stability of the $R_{PE}$ measurement made; and further wherein the means of indication is setup to optionally indicate one or a combination of the following parameters:

If the wiring of the combined device to the electrical installation comprising a line conductor (L), a neutral conductor (N), and a protective conductor (PE) or protected earth neutral conductor (PEN) is correct;

If a supply voltage of an alternating network ($v_L$) falls within predetermined normal limits such that $v_L$ is between $v_{Lmin}$ and $v_{Lmax}$, wherein $v_{Lmin}$ and $v_{Lmax}$ represent a lower supply voltage limit and an upper supply voltage limit, respectively;

If an earthing system voltage ($v_{PE}$) is greater than or equal to an earthing system threshold voltage ($v_{PEmax}$).

2. The combined device for protection against transient overvoltages and monitoring of an electrical installation, according to claim 1, wherein the output parameters of the means of indication comprise an indication of whether at least one of the protective component(s) that is integrated into the combined device has reached the end of its useful life.

3. The combined device for protection against transient overvoltages and monitoring of an electrical installation, according to claim 1, wherein it is formed by a set of one or more cartridge(s) inserted in a fixed base, in which each cartridge comprises the one or more protective components, and inside at least one of the cartridges there are the means of monitoring, and the means of indication.

4. The combined device for protection against transient overvoltages and monitoring of an electrical installation, according to claim 1, wherein it is formed by one monoblock, which comprises the one or more protective components, and which has inside the means of monitoring, and the means of indication.

5. The combined device for protection against transient overvoltages and monitoring of an electrical installation, according to claim 1, wherein the means of indication are configured by a first type of indicator and a second type of indicator, wherein:

the first type of indicator is activated in different manners of indication for providing information about whether the connection to the mains is incorrect and/or voltage $v_{PE} \geq v_{PEmax}$ and/or mains voltage ($v_L$) meets the condition of $v_{Lmin} > v_L > v_{Lmax}$; when all of the aforesaid is correct, the first type of indicator issues a corresponding indication in accordance with the $R_{PE}$ value obtained within the predetermined margins;

the second type of indicator issues an indication, lighted or not, if the protective component(s) included in the cartridge or in the monoblock in which the said second indicator is located has reached the end of its useful life.

6. The combined device for protection against transient overvoltages and monitoring of an electrical installation, according to claim 1, wherein the means of indication are configured by a first type of indicator, wherein:

the first type of indicator is activated in different manners of indication to provide information about whether the mains connection is incorrect and/or voltage $v_{PE} \geq v_{PE\text{-}max}$ and/or mains voltage ($v_L$) meets the condition of $v_{Lmin} > v_L > v_{Lmax}$; when all of the aforesaid is correct, the first type of indicator issues a corresponding indication in accordance with the $R_{PE}$ value obtained within the predetermined margins.

7. The combined device for protection against transient overvoltages and monitoring of an electrical installation, according to claim 6, wherein the first type of indicator also gives another additional indication, when the protective component(s) included in the cartridge where said first indicator is located reaches the end of its useful life.

8. The combined device for protection against transient overvoltages and monitoring of an electrical installation, according to claim 1, wherein it comprises means for disconnecting from the supply voltage at least one of the protective component group(s) that are built into the protective device.

9. The combined device for protection against transient surges and monitoring of an electrical installation, according to claim 1, wherein it comprises certain means of wireless and/or cable transmission or communication of the measured parameters processed by the means of monitoring to another combined device(s) or another type of device(s) inside or outside of the place where the combined device is installed.

10. The combined device for protection against transient overvoltages and monitoring of an electrical installation, according to claim 1, wherein the means of monitoring and means of indication are integrated into an electronic circuit.

11. The combined device for protection against transient overvoltages and monitoring of an electrical installation, according to claim 10, wherein the electronic circuit is totally or partially integrated in one of the cartridges that form the combined device of plug-in cartridges type.

12. The combined device for protection against transient overvoltages and monitoring of an electrical installation, according to claim 1, wherein the value of the resistance of the earth system ($R_{PE}$) is obtained by determining the increase in voltage caused by the current impulses injected over the existing voltage in the earth system.

13. The combined device for protection against transient overvoltages and monitoring of an electrical installation, according to claim 1, wherein the preferred values of an impulse duration ($T_{imp}$) are comprised between 200 µs < $T_{imp}$ < 300 µs.

14. The combined device for protection against transient overvoltages and monitoring of an electrical installation, according to claim 10, wherein the electronic circuit comprises at least:
An AC/DC converter, which supplies a DC voltage ($V^+$) with respect to a common circuit point (GND), which is connected to the N terminal of the cartridge;
A controller, which is supplied by the voltage $V^+$; and
Two adapters, which also are supplied by the voltage $V^+$; the output voltage of these adapters, $v_1(t)$ and $v_2(t)$ respectively, supply a DC voltage to the controller, normally $V^+/2$, to obtain a maximum dynamic range and superimposed AC voltage proportional to respective input voltages, wherein $v_1(t)=V^+/2+k_1\, v_L(t)$ and $v_2(t)=V^+/2+k_2\, v_{PE}(t)$, and wherein k1 and k2 each represent a gain or an attenuation.

15. The combined device for protection against transient overvoltages and monitoring of an electrical installation, according to claim 1, wherein the current impulses are injected between an angle of $\theta \geq 90°$ and $\leq 150°$ in relation to the positive half cycle of the supply voltage wherein a specific number of pulses are grouped in bursts.

16. The combined device for protection against transient overvoltages and monitoring of an electrical installation, according to claim 15, wherein the decision criterion to adjust the injection angle θ in each half cycle of a burst based on the voltage value $v_L$ (θ=90°) is preferably modified in accordance with the $R_{PE}$ value obtained for the previous burst, so that as the $R_{PE}$ increases, the θ value progressively increases to further decrease the current and vice versa.

17. The combined device for protection against transient overvoltages and monitoring of an electrical installation, according to claim 15, wherein the resistance of the earth system ($R_{PE}$) is determined for a burst, by averaging the $R_{PE}$ values measured for each impulse of the burst.

18. The combined device for protection against transient overvoltages and monitoring of an electrical installation, according to claim 17, wherein the average $R_{PE}$ value obtained for several previous bursts is used to make the system more stable.

19. The combined device for protection against transient overvoltages and monitoring of an electrical installation, according to claim 15, wherein the injected current is reduced by reducing a number of impulses per burst, as long as the $R_{PE}$ stability is good, maintaining an impulse width ($T_{imp}$) as well as a separation between bursts ($T_r$).

20. The combined device for protection against transient overvoltages and monitoring of an electrical installation, according to claim 16, wherein the injected current is reduced by reducing a duration of impulses ($T_{imp}$), as long as the $R_{PE}$ stability is good.

21. The combined device for protection against transient overvoltages and monitoring of an electrical installation, according to the claim 10, wherein the electronic circuit comprises, in an integrated manner, a dual protection against transient overvoltages:
A first protection stage comprising the protective component(s), which absorb(s) most of the energy of the transient overvoltages, leaving a lower residual voltage between its two poles;
A second protection stage in which the residual voltage is limited to acceptable values, which prevents the destruction or malfunction of the means of monitoring, as it causes much greater reduction in disturbances that could affect it, either due to the residual voltage of the protective component, or due to the electromagnetic field that is generated.

22. A plug-in cartridge, of the type that are inserted alone or together with other plug-in cartridges in a fixed base to form a combined device for electrical protection against transient overvoltages and the monitoring of an electrical installation of the type that are used in single-phase or multiphase alternating voltage installations, in which each cartridge comprises: one or more protective components protecting against transient overvoltages and being a varistor(s), gas arrester(s), gas discharge tube(s), spark-gap(s), suppressor diode(s), triac(s), thyristor(s), and/or MOSFET(s); means of monitoring set up in such a manner as to permanently measure and process one or several parameters in relation to the condition of the electrical installation and the one or more protective components; and a means of indication connected to said means of monitoring and configured to indicate the following output parameter:
If the value of earth resistance ($R_{PE}$) measured by the means of monitoring is inside or outside of certain predetermined limits ($R_{PEmin}$ and $R_{PEmax}$) wherein the earth resistance value $R_{PE}$ measured by the means of monitoring is based on the injection of current impulses to earth via a PE terminal using a phase to earth loop and these impulses are of high enough intensity to determine the increase in voltage caused by the injected impulses with regard to voltage in an earth system, but without triggering a possible residual current circuit device(s) (RCD) which is/are installed in the electrical installation, or causing a malfunction of the residual current circuit device(s) in the long term;

wherein the means of monitoring uses a dynamic method to control an angle of injection of the current impulses, depending on the AC supply voltage, and/or resistance of the earth system $R_{PE}$, and/or the stability of the $R_{PE}$ measurement made; and further wherein the means of indication is setup to optionally indicate one or a combination of the following parameters:

Indication of whether at least one of the protective component(s) protecting against overvoltages that are built into the cartridge has reached the end of its useful life;

If the wiring between the cartridge and the electrical installation comprising a line conductor (L), a neutral conductor (N), and a protective conductor (PE) or protected earth neutral conductor (PEN) is correct;

If a supply voltage of an alternating network ($v_L$) falls within predetermined normal limits such that $v_L$ is between $v_{Lmin}$ and $v_{Lmax}$, wherein $v_{Lmin}$ and $v_{Lmax}$ represent a lower supply voltage limit and an upper supply voltage limit, respectively;

If an earth system voltage ($v_{PE}$) is greater than or equal to an earthing system threshold voltage ($v_{PEmax}$).

23. The plug-in cartridge, according to claim 22, further comprising a means for disconnecting from the supply voltage at least one of the protective components that are integrated into the cartridge.

24. An operational procedure for a combined device for protection against transient overvoltages and monitoring of an electrical installation, according to claim 1, wherein the means of indication are configured by a first type of indicator and by a second type of indicator, wherein:

the first type of indicator is activated in different stages of indication to provide information about whether the connection to the mains is incorrect, and/or voltage $v_{PE} \geq V_{PEmax}$, and/or the mains voltage ($v_L$) meets the condition of $v_{Lmin} > v_L > v_{Lmax}$; when all of the aforesaid is correct, the first type of indicator issues a corresponding indication depending on the obtained $R_{PE}$ value falling within predetermined margins;

the second type of indicator emits an indication, if the protective component(s) included in the cartridge or in the monoblock in which the said second indicator is located has reached the end of its useful life, characterized in that the order of actuation of the different stages and different activation conditions of the first type of indicator are:

Stage 1 (optional stage): Delay;
Stage 2: If the connection to the mains is incorrect→Indication 1 is activated;
Stage 3: If voltage $v_{PE} \geq V_{PEmax}$→ Indication 2 is activated;
Stage 4: If mains voltage ($v_L$) has such a value that $v_{Lmin} \geq v_L > v_{Lmax}$→Indication 3 is activated;
Stage 5: If all the above conditions are correct, then the first type of indicator issues the corresponding indication in accordance with the $R_{PE}$ value obtained within predetermined margins of values of the resistance of the earthing system ($R_{PE}$).

25. An operational procedure for a combined device for protection against transient overvoltages and monitoring of an electrical installation, according to claim 1, wherein the means of indication are configured by a first type of indicator, where the first type of indicator is activated in different stages of indication to provide information about whether the connection to the mains is incorrect, and/or voltage $v_{PE} \geq V_{PEmax}$, and/or mains voltage ($v_L$) meets the condition of $v_{Lmin} > v_L > v_{Lmax}$; when all of the aforesaid is correct, the first type of indicator issues a corresponding indication in accordance with the $R_{PE}$ value obtained within the predetermined margins, characterized in that the order of actuation of the different stages and different activation conditions of the first type of indicator are:

Stage 1 (optional stage): Delay;
Stage 2: If the connection to the mains is incorrect→Indication 1 is activated;
Stage 3: If voltage $v_{PE} \geq V_{PEmax}$→Indication 2 is activated;
Stage 4: If mains voltage ($v_L$) has such a value that $v_{Lmin} > v_L > v_{Lmax}$→Indication 3 is activated;
Stage 5: If all the above conditions are correct, then the first type of indicator issues the corresponding indication in accordance with the $R_{PE}$ value obtained within predetermined margins of values of the resistance of the earthing system ($R_{PE}$).

26. The operational procedure, according to the claim 24, wherein the first type of indicator also gives another additional indication, when the protective component(s) included in the cartridge where said first indicator is located reaches the end of its useful life.

27. The operational procedure, according to the claim 24, wherein the predetermined margins of values of the resistance of the earthing system ($R_{PE}$) are preferably:

Margin 1: $R_{PE} < 30\ \Omega$
Margin 2: $30\ \Omega \geq R_{PE} < 60\ \Omega$
Margin 3: $60\ \Omega \geq R_{PE} < 600\ \Omega$
Margin 4: $R_{PE} \geq 600\ \Omega$.

* * * * *